US009433045B2

(12) United States Patent
Chiang (10) Patent No.: US 9,433,045 B2
(45) Date of Patent: Aug. 30, 2016

(54) DRIVE CIRCUIT WITH AN EXTERNAL MODE-ADJUSTING PIN

(71) Applicant: TAIWAN SEMICONDUCTOR CO., LTD., New Taipei (TW)

(72) Inventor: Yueh-Hua Chiang, New Taipei (TW)

(73) Assignee: Taiwan Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 14/598,453

(22) Filed: Jan. 16, 2015

(65) Prior Publication Data

US 2016/0135259 A1    May 12, 2016

(30) Foreign Application Priority Data

Nov. 7, 2014   (TW) .............................. 103138681 A (51) Int. Cl.
*H05B 33/08* (2006.01)
*H03K 17/687* (2006.01)

(52) U.S. Cl.
CPC ........ *H05B 33/0815* (2013.01); *H03K 17/687* (2013.01); *H05B 33/0845* (2013.01)

(58) Field of Classification Search
CPC .......... H05B 33/0815; H05B 33/0845; H05B 33/0812; H05B 33/0887
USPC ................. 315/287, 291, 307, 224
See application file for complete search history.

(56) References Cited

U.S. PATENT DOCUMENTS

| | | | | |
|---|---|---|---|---|
| 6,943,504 B1 * | 9/2005 | York | .................. | H05B 33/0815 315/224 |
| 2010/0079127 A1 * | 4/2010 | Grant | .................... | H02M 3/156 323/285 |
| 2010/0201283 A1 * | 8/2010 | Kawata | .............. | H05B 33/0818 315/287 |
| 2010/0327836 A1 * | 12/2010 | Li | ........................ | H02M 3/1588 323/283 |
| 2012/0075891 A1 * | 3/2012 | Zhang | .................... | H02M 3/335 363/21.18 |
| 2012/0187997 A1 * | 7/2012 | Liao | .................... | H05B 33/0854 327/299 |
| 2012/0286752 A1 * | 11/2012 | Tsukiji | .................. | H02M 3/156 323/282 |
| 2014/0009080 A1 * | 1/2014 | Xu | ..................... | H05B 33/0815 315/224 |
| 2014/0246988 A1 * | 9/2014 | Chen | .................. | H05B 33/0815 315/223 |
| 2015/0084544 A1 * | 3/2015 | Mitterbacher | ..... | H05B 33/0818 315/294 |
| 2015/0237693 A1 * | 8/2015 | Knoedgen | .......... | H05B 33/0815 315/224 |

* cited by examiner

*Primary Examiner* — Douglas W Owens
*Assistant Examiner* — Syed M Kaiser
(74) *Attorney, Agent, or Firm* — Rosenberg, Klein & Lee (57) ABSTRACT

A drive circuit with an external mode-adjusting pin includes an operational mode control circuit and a drive processing circuit. The operational mode control circuit further includes a current mirror circuit, a resistor, a capacitor and a comparator. The first comparator input port receives a reference voltage. The second comparator input port couples the second output port of the current mirror and the capacitor. The current mirror circuit bases on a resistor current to generate a charge current for charging the capacitor. As the charge voltage at the second comparator input port reaches a reference voltage, a trigger signal is outputted to the drive processing circuit for controlling the switches thereof. The external pin is defined to one end of the resistor or the capacitor for varying the resistance or the capacitance respectively to determine the operational mode for the driven circuit.

5 Claims, 8 Drawing Sheets

DRIVE CIRCUIT WITH AN EXTERNAL MODE-ADJUSTING PIN

This application claims the benefit of Taiwan Patent Application Serial 103138681, filed Nov. 7, 2014, the subject matter of which is incorporated herein by reference.

BACKGROUND OF INVENTION

1. Field of the Invention

The invention relates to a drive circuit with an external mode-adjusting pin, and more particularly to the drive circuit with an external mode-adjusting pin that implements an external pin for selecting either a resistor or a capacitor to determine the operational mode of a driven circuit.

2. Description of the Prior Art

Figure 1:
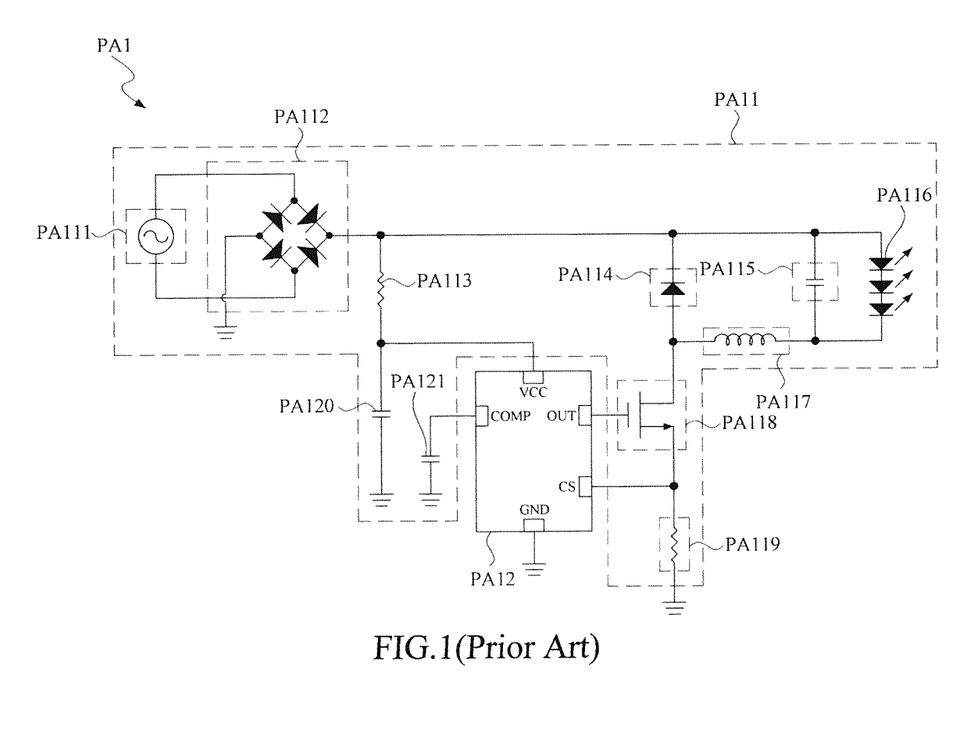
FIG. 1 is a schematic view of a conventional operational element integrated circuit.

Referring now to FIG. 1, a conventional operational element integrated circuit is illustrated. As shown, this conventional operational element integrated circuit PA1 includes a driven circuit PA11 and a drive circuit PA12, in which the driven circuit PA11 is particularly an LED circuit further having a power source PA111, a full wave bridge rectifier circuit PA112, a resistor PA113, a diode PA114, a capacitor PA115, at least one operational element PA116 (LED herein), an inductor PA117, a first switch PA118, a resistor PA119 and two capacitors PA120, PA121.

The full wave bridge rectifier circuit PA112 is coupled with the power source PA111, and also couples the resistor PA113, the diode PA114, the capacitor PA115 and the operational element PA116. One end of the inductor PA117 is coupled with the diode PA114 and a drain of the first switch PA118, while another end thereof is coupled with the capacitor PA115 and the operational element PA116. The resistor PA119 is coupled with a source of the first switch PA118, and also couples a CS port of the drive circuit PA12. The capacitor PA120 is coupled with the resistor PA113, and also couples a VCC port of the drive circuit PA12. The capacitor PA121 is coupled with a COMP port of the drive circuit PA12. The first switch PA118 is coupled with an OUT port of the drive circuit PA12.

In this conventional operational element integrated circuit, as the first switch PA118 is ON, the inductor PA117 would generate a induced current. Generally speaking, the operational mode of the driven circuit PA11 is determined by the ON time of the first switch PA118 (for controlling up and down of the induced current). Further, major operational modes include a continuous conduction mode (CCM), a discontinuous conduction mode (DCM) and a boundary conduction mode (BCM). In addition, the operational mode is specified by the charge/discharge of the induced current.

Nevertheless, the aforesaid operational modes may exist different merits and shortcomings. In practical usage in the art, for the conventional driven circuit PA11 is limited to the specific circuit structuring, thus it is usual that only one single operational mode is applied in consideration of the efficiency, electromagnetic interference and costing. Obviously, as soon as a specific operational mode is chosen in the initial application, then all the follow-up applications of this current circuit would be inevitably to apply the same old operational mode, even though another operational mode may be much more appropriate. Hence, the embedded inconvenience therefrom is apparent.

SUMMARY OF THE INVENTION

Accordingly, in considering aforesaid limitation on the structuring of the current driven circuit, from which the operational mode is un-changeable, it is the primary object of the present invention to provide a drive circuit with an external mode-adjusting pin, that implements an external pin for selecting either a resistor or a capacitor to determine the operational mode of a driven circuit.

In the present invention, the drive circuit with an external mode-adjusting pin is to drive a driven circuit and to furnish an operational mode to the driven circuit. The driven circuit includes a first switch, an inductor and at least one operational element. The first switch is coupled with one end of the inductor, while another end of the inductor is coupled to the operational element. As the first switch is turned on, the inductor would generate an induced current. The drive circuit with an external mode-adjusting pin includes an operational mode control circuit and a drive processing circuit. The operational mode control circuit includes a current mirror circuit, a power circuit, a resistor, a capacitor and a control comparator. The current mirror circuit has a first output port and a second output port. The power circuit is coupled to the first output port and has a voltage input port defined with an input voltage. The resistor is coupled with the voltage input port of the power circuit. The capacitor is coupled to the second output port of the current mirror circuit. The control comparator has a first comparator input port, a second comparator input port and a comparator output port, in which the first comparator input port is to receive a first reference voltage, and the second comparator input port is coupled with the second output port and the capacitor. The input voltage makes the resistor generate a resistor current, and the current mirror circuit bases on the resistor current further to generate a corresponding charge current for charging the capacitor. Also, as a charge voltage at the second comparator input port reaches the first reference voltage after a delay time, the comparator output port of the control comparator would output a trigger signal. The drive processing circuit electrically connected with the comparator output port and the first switch is to receive the trigger signal and bases on the trigger signal to turn on the first switch so as to control the induced current of the inductor to select an operational mode for the driven circuit. In the present invention, one of the voltage input port and the second comparator input port is defined as the external pin for varying either the resistance value of the resistor or the capacitance value of the capacitor to determine the operational mode for the driven circuit.

In one embodiment of the present invention, the power circuit includes a control calculator and a transistor. The control calculator further has a calculator input port, a voltage input port and an operational output port. The calculator input port is to receive a second reference voltage substantially equal to the input voltage. The voltage input port is coupled to one end of the resistor, while another end of the resistor is grounded. The gate of the transistor is coupled with the operational output port, the source thereof is coupled with the voltage input port, and the drain thereof is coupled with the first output port. In addition, the operational mode control circuit can further include a second switch coupling the second output port of the current mirror circuit, the second comparator input port and one end of the capacitor. Also, the second switch couples the drive processing circuit to receive an ON control signal for controlling the delay time. Further, the operational mode can be one of a continuous conduction mode (CCM), a discontinuous conduction mode (DCM) and a boundary conduction mode (BCM).

In one embodiment of the present invention, the drive processing circuit includes a first drive comparator, a drive operational amplifier, an OR gate, an SR flip-flop, a drive circuit, an AND gate and a second drive comparator. The first drive comparator has a first drive comparator input port, a second drive comparator input port and a first drive comparator output port. The first drive comparator input port is to receive a third reference voltage. The second drive comparator input port couples the drive circuit with an external mode-adjusting pin. The first drive comparator output port couples the second switch. As soon as the voltage at the second drive comparator input port reaches the third reference voltage, the first drive comparator output port would turn on the second switch. The drive operational amplifier has a first drive operational input port, a second drive operational input port and a drive operational output port. The first drive operational input port is to receive a fourth reference voltage. The second drive operational input port couples the drive circuit with an external mode-adjusting pin and the second drive comparator input port. The drive operational output port couples the drive circuit and bases on the fourth reference voltage and the voltage at the calculator input port to output a DC voltage. The SR flip-flop couples the OR gate. The drive circuit couples the SR flip-flop. The AND gate couples the comparator output port of the control comparator and the first drive comparator output port of the first drive comparator. As the comparator output port outputs the trigger signal and the first drive comparator output port outputs the high-level signal, the AND gate sends a first high-level signal to the SR flip-flop so as to trigger the drive circuit to further turn on the first switch. The second drive comparator has a third drive comparator input port, a fourth drive comparator input port and a second drive comparator output port. The third drive comparator input port is to receive a sawtooth wave. The fourth drive comparator input port couples the drive operational output port and the drive circuit with an external mode-adjusting pin. The second drive comparator output port couples the OR gate. As the sawtooth wave reaches a DC voltage, the second drive comparator output port sends a second high-level signal to the OR gate, and the OR gate further forwards the second high-level signal to the SR flip-flop, so as to trigger the drive circuit to turn off the first switch.

In one embodiment of the present invention, the driven circuit is an LED circuit, and the operational element is an LED.

By providing the drive circuit with an external mode-adjusting pin of the present invention, the user can directly apply the external pin to select either a resistor or a capacitor and to vary the corresponding resistance or the capacitance so as to determine the operational mode of the driven circuit for charging the capacitor. Accordingly, various operational modes can be accessed arbitrarily by the user in consideration of efficiency, energy regulations, electromagnetic interference and any other practical factor, and thus usage convenience as well as the preferred operational mode can be easily obtained.

All these objects are achieved by the drive circuit with an external mode-adjusting pin described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a drive circuit with an external mode-adjusting pin. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Though various embodiments of the drive circuit with an external mode-adjusting pin in accordance with the present invention may be constructed with slight variations, yet only four exemplary embodiments are provided herein to elucidate the details of the present invention.

Figure 2:
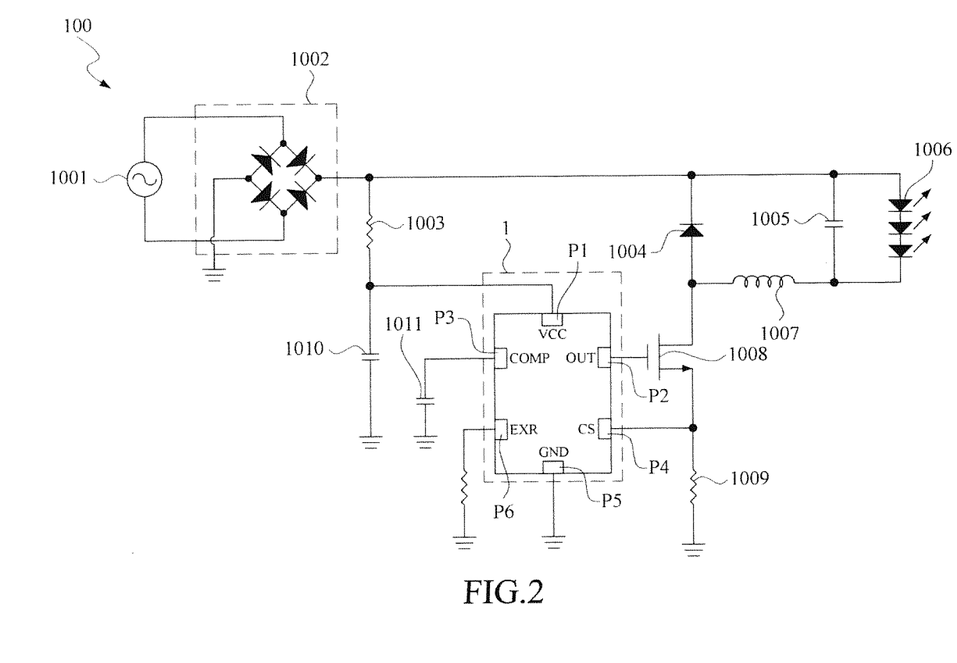
FIG. 2 shows an application of a first embodiment of the drive circuit with an external mode-adjusting pin in accordance with the present invention, in driving a driven circuit.
Figure 3:
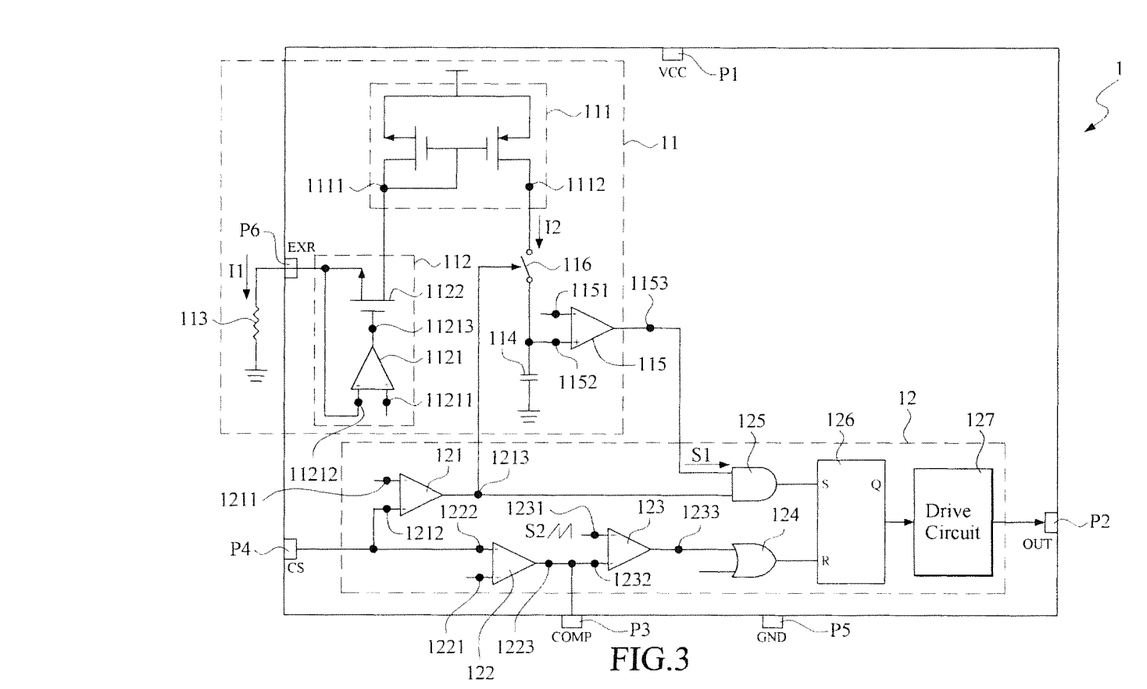
FIG. 3 is a schematic view of the first embodiment of the drive circuit with an external mode-adjusting pin in accordance with the present invention.

Refer now to FIG. 2 and FIG. 3, in which FIG. 2 shows an application of a first embodiment of the drive circuit with an external mode-adjusting pin in accordance with the present invention in driving a driven circuit and FIG. 3 is a schematic view of the first embodiment of FIG. 2. It shall be noted in advance that the term "couple" in the following description stands either "couple directly" or "couple indirectly".

As shown, in this first embodiment, the drive circuit with an external mode-adjusting pin 1 is to drive the driven circuit 100 and to provide selectively an operational mode to the driven circuit 100, in which the operational mode can be one of a continuous conduction mode (CCM), a discontinuous conduction mode (DCM) and a boundary conduction mode (BCM).

In the present invention, a packed IC for the drive circuit with an external mode-adjusting pin 1 includes a VCC port P1, an OUT port P2, a COMP port P3, a CS port P4, a GND port P5 and an EXR port P6. In addition, the driven circuit 100, embodied as an LED circuit, includes a power source 1001, a full wave bridge rectifier circuit 1002, a resistor 1003, a diode 1004, a capacitor 1005, at least one operational element 1006, an inductor 1007, a first switch 1008, a resistor 1009, a capacitor 1010 and a capacitor 1011.

Further, in some other embodiments not shown herein, the driven circuit 100 can be a power circuit having an inductor able to modulate the aforesaid operational modes. Such embodiments shall be also included as feasible examples of the present invention.

As shown, the full wave bridge rectifier circuit 1002 coupled with the power source 1001 further couples the resistor 1003, the diode 1004, the capacitor 1005 and the operational element 1006, in which the operational element 1006 is an LED. One end of the inductor 1007 is coupled with the diode 1004 and a drain of the first switch 1008, while another end thereof is coupled with the capacitor 1010 and the operational element 1006. The resistor 1009 coupled with a source of the first switch 1008 further couples the CS port P4 of the drive circuit with an external mode-adjusting pin 1.

The capacitor 1010 coupled with the resistor 1003 further couples the VCC port P1 of the drive circuit with an external mode-adjusting pin 1. The capacitor 1011 is coupled with the COMP port P3 of the drive circuit with an external mode-adjusting pin 1. A gate of the first switch 1008 coupled with the OUT port P2 of the drive circuit with an external mode-adjusting pin 1 is coupled to the power source 1001 through the diode 1004 and the full wave bridge rectifier circuit 1002 so as to be energized by the power source 1001. While the power is ON, the voltage of the power source 1001 would impose on the inductor 1007 to induce an induced current (not shown in the figure).

As shown in FIG. 3, the drive circuit with an external mode-adjusting pin 1 includes an operational mode control circuit 11 and a drive processing circuit 12. The operational mode control circuit 11 further includes a current mirror circuit 111, a power circuit 112, a resistor 113, a capacitor 114, a control comparator 115 and a second switch 116. The current mirror circuit 111 has a first output port 1111 and a second output port 1112, and is coupled with a power source (not shown in the figure). In this embodiment, the current mirror circuit 111 is consisted of two MOS transistors, but in some other embodiments other types of the current mirrors are also applicable.

The power circuit 112 is coupled with the first output port 1111. Practically, the power circuit 112 includes a control calculator 1121 and a transistor 1122. The control calculator 1121 further has a calculator input port 11211, a voltage input port 11212 and an operational output port 11213, in which the calculator input port 11211 is to receive a second reference voltage V2, and the voltage input port 11212 is coupled with one end of the resistor 113 so as to have the voltage of the voltage input port 11212 to be equal to the second reference voltage V2. In this embodiment, the input voltage for the voltage input port 11212 is substantially equal to the second reference voltage. Another end of the resistor 113 is grounded. The operational output port 11213 is couple to a gate of the transistor 1122, while a source of the transistor 1122 is coupled with the voltage input port 11212 and a drain of the transistor 1122 is coupled with the first output port 1111.

The capacitor 114 is coupled to the second output port 1112 of the current mirror circuit 111. The control comparator 115 has a first comparator input port 1151, a second comparator input port 1152 and a comparator output port 1153, in which the first comparator input port 1151 is to receive a first reference voltage V1. The second comparator input port 1152 is coupled with the second output port 1112 and the capacitor 114.

Practically, the second output port 1112 of the current mirror circuit 111, the second comparator input port 1152 and one end of the capacitor 114 are all coupled with the second switch 116, and the second switch 116 is further coupled to the drive processing circuit 12. In the present invention, the second switch 116 is consisted of NMOS switches or PMOS switches. Preferably, in this embodiment, the second switch 116 is the NMOS switch.

The drive processing circuit 12 is electrically coupled with the comparator output port 1153 and the first switch 1008. In practice, the drive processing circuit 12 of this embodiment includes a first drive comparator 121, a drive operational amplifier 122, a second drive comparator 123, an OR gate 124, an AND gate 125, an SR flip-flop 126 and a drive circuit 127. The first drive comparator 121 has a first drive comparator input port 1211, a second drive comparator input port 1212 and a first drive comparator output port 1213, in which the first drive comparator input port 1211 is to receive a third reference voltage V3, the second drive comparator input port 1212 is coupled to the CS port P4 of the drive circuit with an external mode-adjusting pin 1, and the first drive comparator output port 1213 is coupled with the second switch 116.

The drive operational amplifier 122 has a first drive operational input port 1221, a second drive operational input port 1222 and a drive operational output port 1223, in which the first drive operational input port 1221 is to receive a fourth reference voltage V4, the second drive operational input port 1222 is coupled to both the CS port P4 of the drive circuit with an external mode-adjusting pin 1 and the second drive comparator input port 1212, and the drive operational output port 1223 is coupled to the COMP port P3 of the drive circuit with an external mode-adjusting pin 1.

The second drive comparator 123 has a third drive comparator input port 1231, a fourth drive comparator input port 1232 and a second drive comparator output port 1233, in which the third drive comparator input port 1231 is to receive a sawtooth wave S2, the fourth drive comparator input port 1232 is coupled to both the drive operational output port 1223 and the COMP port P3 of the drive circuit with an external mode-adjusting pin 1.

An input end (not shown in the figure) of the OR gate 124 is coupled with the second drive comparator output port 1233, while another end thereof is coupled to an over current protection circuit (not shown in the figure). An input end (not shown in the figure) of the AND gate 125 is coupled with the comparator output port 1153 of the control comparator 115, while another input end thereof is coupled to the first drive comparator output port 1213. The R end of the SR flip-flop 126 is coupled to the output of the OR gate 124, the S end thereof is coupled to the output of the AND gate 125, and the Q end thereof is coupled to the drive circuit 127. Also, the drive circuit 127 is coupled to the OUT port P2 of the drive circuit with an external mode-adjusting pin 1. In the present invention, the drive circuit 127 can be any relevant processing circuit already in the marketplace.

In the present invention, the input voltage of the voltage input port 11212 is to make the resistor 113 generate a resistor current I1, from which the current mirror circuit 111 bases on the resistor current I1 to generate a charge current I2. While the second switch 116 is ON, the charge current I2 would charge the capacitor 114. In addition, as the charge voltage at the second comparator input port 1152 reaches a reference voltage V1 after a delay time, the comparator output port 1153 of the control comparator 115 would output a trigger signal S1 to be received by the drive processing circuit 12 as the signal "1". The first switch 1008 is turned on by the trigger signal S1 so as to control the induced current of the inductor 1007 to further determine the operational mode of the drive circuit with an external mode-adjusting pin 1.

In this embodiment, as long as the voltage at the second drive comparator input port 1212 reaches the third reference voltage V3, a high-level signal "1" would be triggered to turn on the second switch 116 and further to charge the capacitor 114 by the charge current I2. While the comparator output port 1153 output the trigger signal S1, the AND gate 125 would send the first high-level signal ("1" as well) to the SR flip-flop 126 so as to trigger the Q end of the SR flip-flop 126 to inform the drive circuit 127 to turn on the first switch 1008.

Further, in order to turn off the first switch 1008, the drive operational output port 1223 would keep outputting a DC voltage to the fourth drive comparator input port 1232 of the second drive comparator 123. As soon as the voltage of the third drive comparator input port 1231 during receiving the sawtooth wave S2 reaches the DC voltage of the fourth drive comparator input port 1232, the second drive comparator output port 1233 would output the second high-level signal ("1" as well) to go through the OR gate 124 and then to reach the R end of the SR flip-flop 126, such that the drive circuit 127 is triggered to turn off the first switch 1008. Upon such an arrangement, ON/OFF of the first switch 1008 of this embodiment can be controlled in accordance with the aforesaid ON/FF mechanism.

Figure 4:
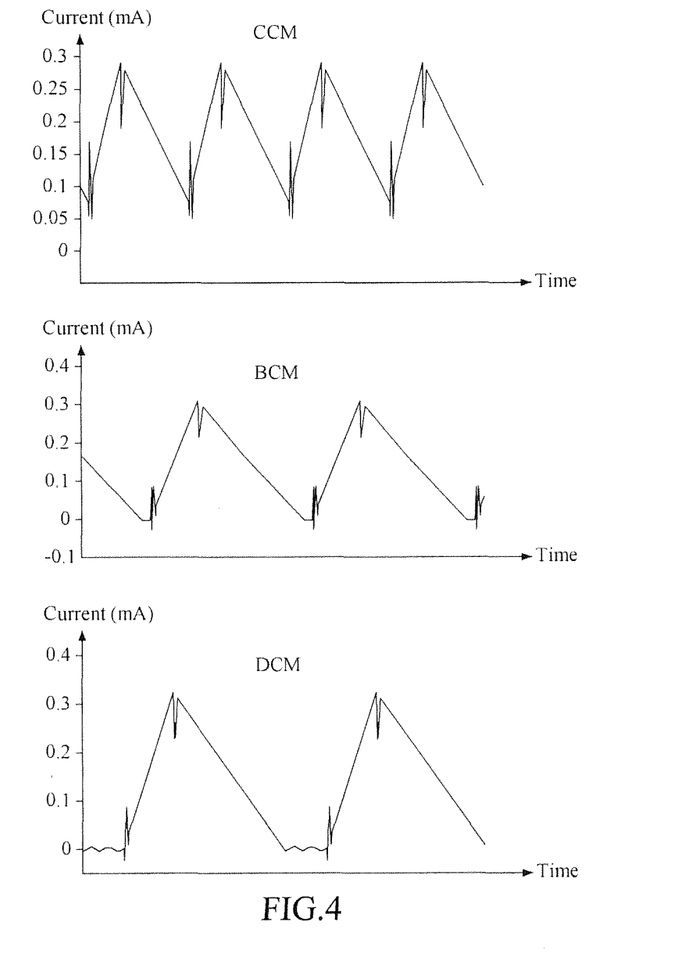
FIG. 4 shows schematically waveforms of various operational modes for the driven circuit.

Refer now to FIG. 2 and FIG. 4, in which FIG. 4 shows schematically waveforms of various operational modes for the driven circuit. As shown, different to the conventional design described above in the background section, this IC embodiment of the drive circuit with an external mode-adjusting pin 1 in accordance with the present invention implements an external pin (for example, the EXR port P6 of FIG. 2, or the EXC port P6a of FIG. 5). Through the external pin to control the ON/OFF timing of the first switch 1008, the operational mode can be adjusted. More precisely, while the operational mode is at the CCM, the first switch 1008 would be turned on earlier so as to have the induced current to bounce back before hitting the zero. While the operational mode is at the BCM, the first switch 1008 would be immediately turned on at the moment of the induced current hitting the zero so then that the induced current can bounce back from the zero. While the operational mode is at the DCM, the first switch 1008 would be turned on after the induced current has fallen down to the zero for a short period, and then the induced current begins to rise from the zero line. Namely, the introduction of the external pin according to the present invention would provide the user to decide the ON/OFF timing and style of the first switch 1008.

Further, under the situation of no change in structuring and setting for the drive processing circuit 12 (FIG. 2), if the operational mode is to be varied from the CCM to the BCM (FIG. 4), the external pin EXR port P6 is located at the voltage input port 11212, so that the user can adjust the resistance of the resistor 113 to control the ON/OFF timing. Namely, the more the resistance of the resistor 113 is, the smaller the resistor current I1 would be. Also, the charge current I2 would become smaller as well. Consequently, a longer time for charging the capacitor 114 is required, and thus the ON time of the first switch 1008 would be substantially delayed to the moment that the induced current drops close to the boundary (i.e. the zero line). On the other hand, while in the adjustment to the DCM, the resistance of the resistor 113 can be further increased so as to further delay the ON time of the first switch 1008. Thus, the first switch 1008 would be turned on after the induced current has experienced the zero for a substantial period of time. Obviously, it is clear that, by providing the present invention, the user can determine the operational mode through adjusting the resistance value at the external pin.

Figure 5:
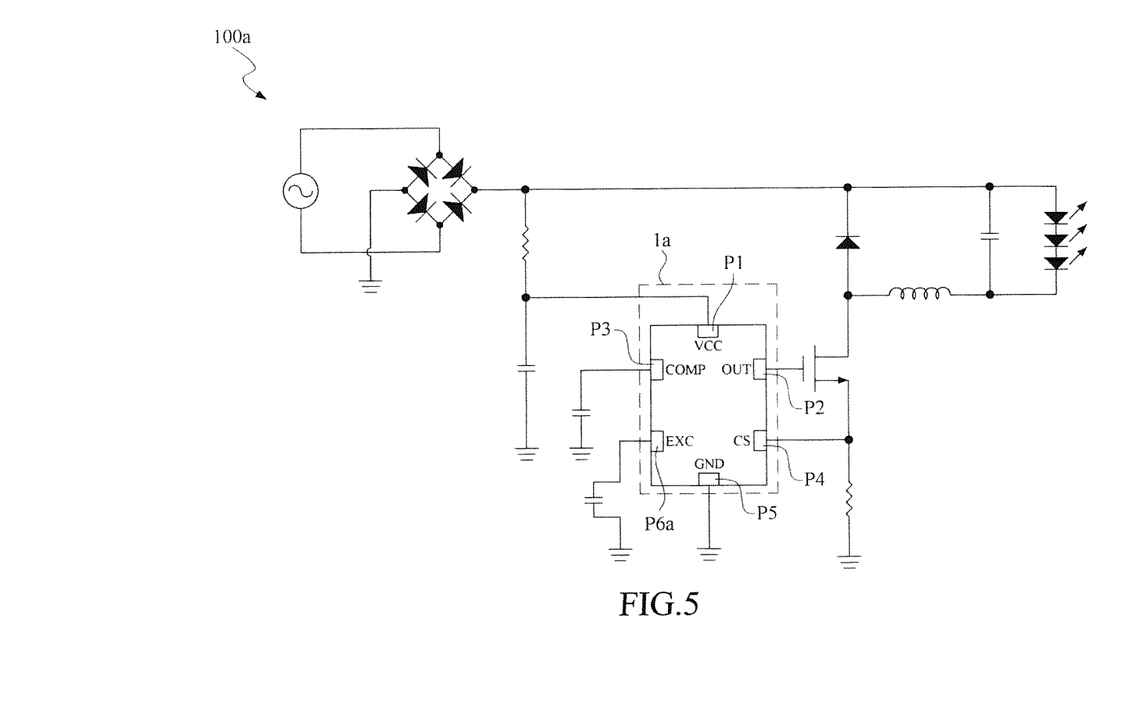
FIG. 5 shows an application of a second embodiment of the drive circuit with an external mode-adjusting pin in accordance with the present invention, in driving a driven circuit.
Figure 6:
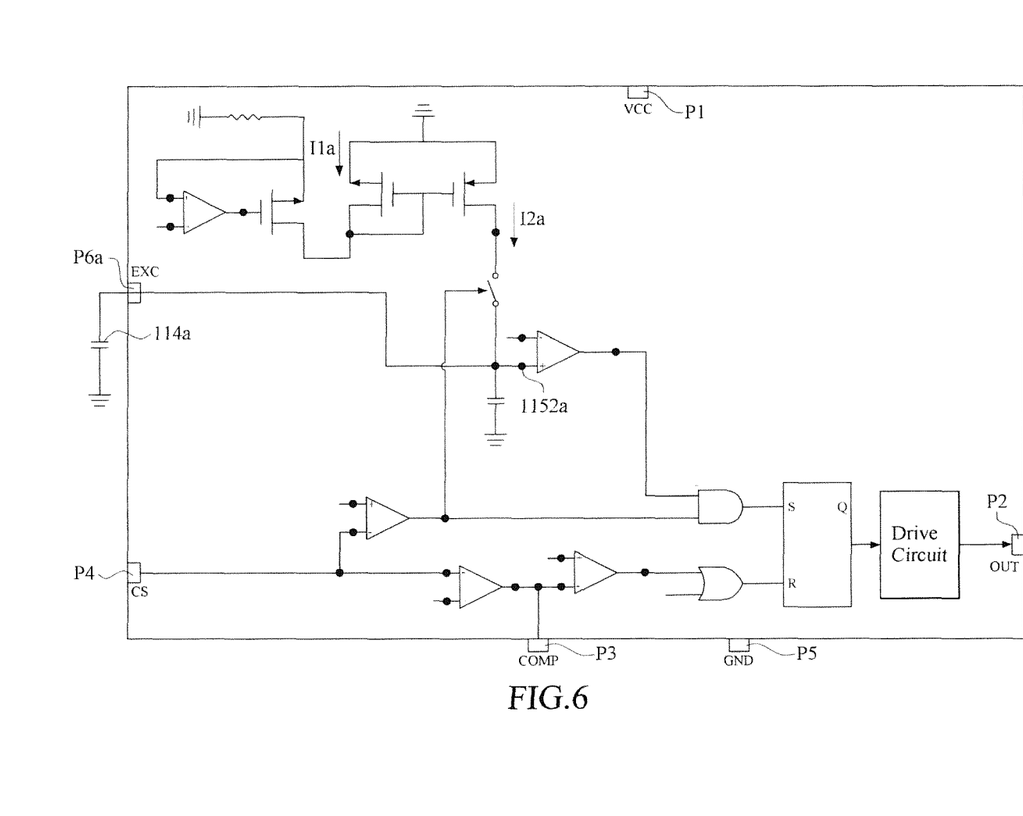
FIG. 6 is a schematic view of the second embodiment of the drive circuit with an external mode-adjusting pin in accordance with the present invention.

Refer now to FIG. 5 and FIG. 6, in which FIG. 5 shows an application of a second embodiment of the drive circuit with an external mode-adjusting pin in accordance with the present invention in driving a driven circuit and FIG. 6 is a schematic view of the second embodiment of FIG. 5. By compared to the first embodiment of FIG. 2 and FIG. 3, this second embodiment displaces the external mode-adjusting pin for the drive circuit 1a to the second comparator input port 1152a. Under such a circumstance, the resistor current I1a is constant, and the charging time of the capacitor 114a can adjusted by controlling the charge current I1a through varying the capacitance value of the capacitor 114a at the external mode-adjusting pin. Apparently, the larger the capacitance value is, the longer charging time would be. On the other hand, a small capacitance value would shorten the charging time. Therefore, in this second embodiment, the operational mode of the driven circuit 100a can be determined by the user through a control upon the capacitance value of the capacitor 114a. Besides, in this second embodiment, all the other setup are the same as that for the first embodiment, and thus details thereabout would be omitted herein.

Figure 7:
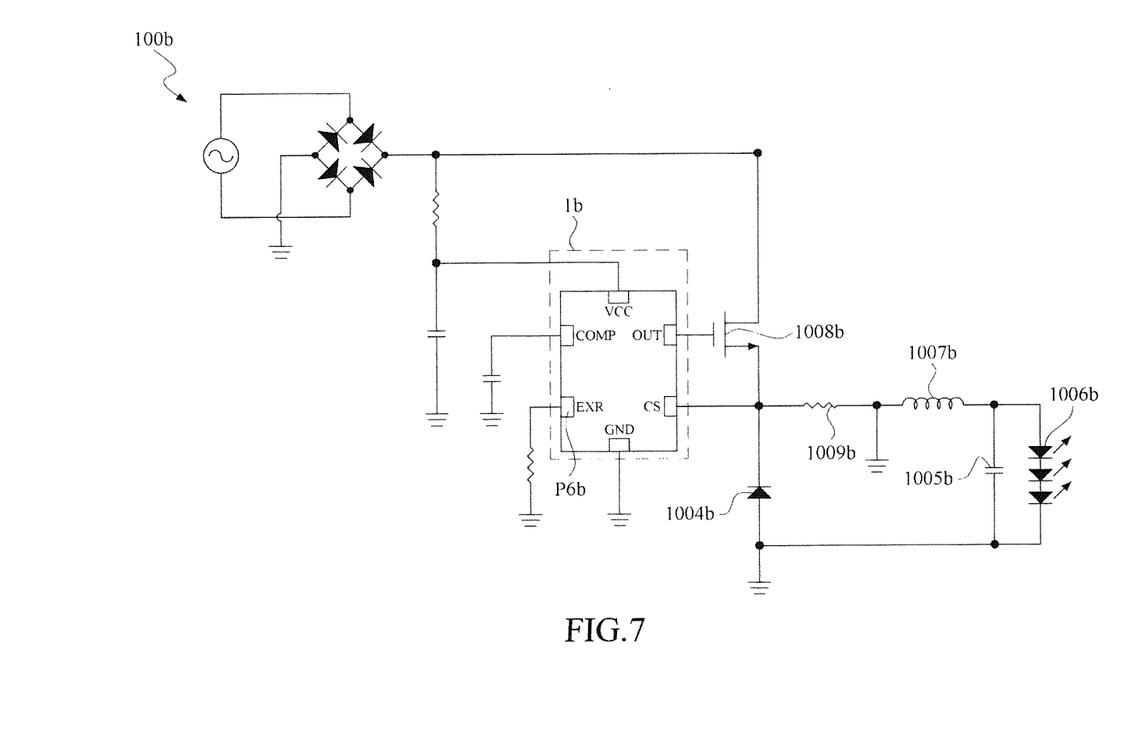
FIG. 7 shows an application of a third embodiment of the drive circuit with an external mode-adjusting pin in accordance with the present invention, in driving a driven circuit.

Refer now to FIG. 7, in which an application of a third embodiment of the drive circuit with an external mode-adjusting pin in accordance with the present invention in driving a driven circuit is shown. By compared to the first embodiment of FIG. 2 and FIG. 3, this third embodiment of the driven circuit 100b is structured in a different connection style. As shown, the source of the switch 1008b is coupled with the diode 1004b and an end of the resistor 1009b, in which another ends of the resistor 1009b and the diode 1004b are both grounded. An end of the inductor 1007b is also grounded, while another end thereof is coupled with the corresponding ends of the capacitor 1005b and the operational element 1006b. The other ends of the capacitor 1005b and the operational element 1006b are both grounded. The external mode-adjusting pin of this third embodiment of the drive circuit is embodied as the EXR port P6b. Besides, in this third embodiment, all the other setup are the same as that for the first embodiment, and thus details thereabout would be omitted herein.

Figure 8:
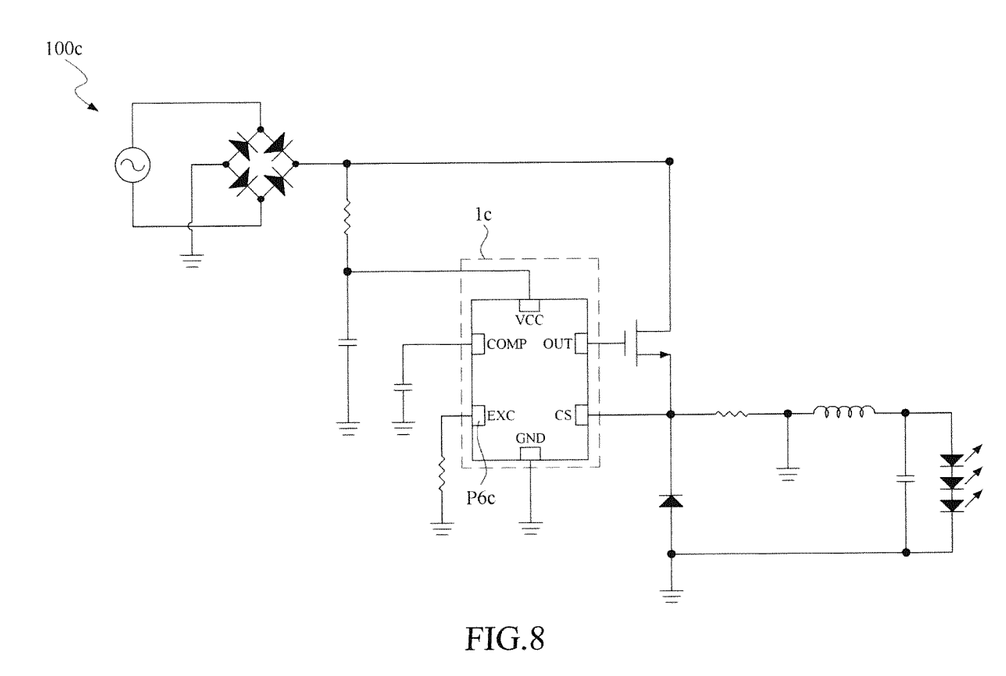
FIG. 8 shows an application of a fourth embodiment of the drive circuit with an external mode-adjusting pin in accordance with the present invention, in driving a driven circuit.

Refer now to FIG. 8, in which an application of a fourth embodiment of the drive circuit with an external mode-adjusting pin in accordance with the present invention in driving a driven circuit is shown. By compared to the third embodiment of FIG. 7, this fourth embodiment 100c defines the external mode-adjusting pin of the drive circuit 1c at the EXC port P6c. Besides, in this fourth embodiment, all the other setup are the same as that for the third embodiment, and thus details thereabout would be omitted herein.

In summary, by providing the drive circuit with an external mode-adjusting pin of the present invention, the user can directly apply the external pin to select either a resistor or a capacitor and to vary the corresponding resistance or the capacitance so as to determine the operational mode of the driven circuit for charging the capacitor. Accordingly, various operational modes can be accessed arbitrarily by the user in consideration of efficiency, energy regulations, electromagnetic interference and any other practical factor, and thus usage convenience as well as the preferred operational mode can be easily obtained.

While the present invention has been particularly shown and described with reference to a preferred embodiment, it will be understood by those skilled in the art that various changes in form and detail may be without departing from the spirit and scope of the present invention.

What is claimed is:

1. A drive circuit with an external mode-adjusting pin, for driving a driven circuit and selecting an operational mode to control the driven circuit, the driven circuit including a first switch energized by a power source, at least one operational element and an inductor electrically bridging the first switch and the at least one operational element, the inductor generating an induced current as the first switch is turned on, the drive circuit comprising:

an operational mode control circuit, further comprising:
a current mirror circuit, having a first output port and a second output port;
a power circuit, coupling the first output port, having a voltage input port with an input voltage;
a resistor, coupling the voltage input port of the power circuit;
a capacitor, coupling the second output port of the current mirror circuit; and
a control comparator, having a first comparator input port, a second comparator input port and a comparator output port, the first comparator input port being to receive a first reference voltage, the second comparator input port being coupled with the second output port and the capacitor, the input voltage energizing the resistor to produce a resistor current for the current mirror circuit to generate a charge current for charging the capacitor, the comparator output port of the control comparator outputting a trigger signal as another charge voltage at the second comparator input port reaches the first reference voltage after a delay time; and a drive processing circuit, electrically connected with the comparator output port and the first switch, for receiving the trigger signal and turning on the first switch according to the trigger signal, so as to determine the operational mode of the driven circuit by controlling the induced current of the inductor;

wherein the external mode-adjusting pin is defined as one of the voltage input port and the second comparator input port for selecting one of a resistance of the resistor and a capacitance of the capacitor, respectively, to determine the operational mode of the driven circuit; and wherein the power circuit includes a control calculator and a transistor, the control calculator having a calculator input port, the voltage input port and an operational output port, the calculator input port being to receive a second reference voltage equal to the input voltage, the voltage input port being coupled to one end of the resistor while another thereof is grounded, the operational output port being coupled with a gate of the transistor while a source of the transistor is coupled to the voltage input port and a drain thereof is coupled to the first output port.

2. The drive circuit with an external mode-adjusting pin of claim 1, wherein the operational mode control circuit further includes a second switch coupling the second output port of the current mirror circuit, the second comparator input port and one end of the capacitor, the second switch further coupling the drive processing circuit to receive a control signal to control the delay time.

3. The drive circuit with an external mode-adjusting pin of claim 2, wherein the drive processing circuit including:

a first drive comparator, having a first drive comparator input port, a second drive comparator input port and a first drive comparator output port, the first drive comparator input port being to receive a third reference voltage, the second drive comparator input port coupling the drive circuit, the first drive comparator output port coupling the second switch, the second switch being turned on while a voltage of the second drive comparator input port reaches the third reference voltage;

a drive operational amplifier, having a first drive operational input port, a second drive operational input port and a drive operational output port, the first drive operational input port being to receive a fourth reference voltage, the second drive operational input port coupling the drive circuit and the second drive comparator input port, the drive operational output port coupling the drive circuit to output a DC voltage according to the fourth reference voltage and a voltage of the second drive operational input port;

an OR gate;

an SR flip-flop, coupling the OR gate;

a drive circuit, coupling the SR flip-flop;

an AND gate, coupling the comparator output port of the control comparator and the first drive comparator output port of the first drive comparator, forwarding a first high-level signal to the SR flip-flop as the comparator output port outputs the trigger signal and the first drive comparator output port outputs a high-level signal, so as to trigger the drive circuit to turn on the first switch; and a second drive comparator, having a third drive comparator input port, a fourth drive comparator input port and a second drive comparator output port, the third drive comparator input port being to receive a sawtooth wave, the fourth drive comparator input port coupling the drive operational output port and the drive circuit, the second drive comparator output port coupling the OR gate for forwarding the second high-level signal to the SR flip-flop, so as further to forward the second high-level signal to the OR gate for triggering the drive circuit to turn off the first switch as the sawtooth wave reaches the DC voltage.

4. The drive circuit with an external mode-adjusting pin of claim 1, wherein the operational mode is one of a continuous conduction mode (CCM), a discontinuous conduction mode (DCM) and a boundary conduction mode (BCM).

5. The drive circuit with an external mode-adjusting pin of claim 1, wherein the driven circuit is an LED circuit and the operational element is an LED.

* * * * *